US010372247B2

(12) United States Patent
Zhou et al.

(10) Patent No.: US 10,372,247 B2
(45) Date of Patent: Aug. 6, 2019

(54) TOUCH DISPLAY PANEL AND MANUFACTURE METHOD THEREOF, DISPLAY DEVICE

(71) Applicants: Boe Technology Group Co., Ltd., Beijing (CN); Chengdu Boe Optoelectronics Technology Co., Ltd., Sichuan (CN)

(72) Inventors: Gang Zhou, Beijing (CN); Mingzhou Guo, Beijing (CN); Xiaofei Yang, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 610 days.

(21) Appl. No.: 14/785,649

(22) PCT Filed: Apr. 28, 2015

(86) PCT No.: PCT/CN2015/077677
§ 371 (c)(1),
(2) Date: Oct. 20, 2015

(87) PCT Pub. No.: WO2016/090817
PCT Pub. Date: Jun. 16, 2016

(65) Prior Publication Data
US 2016/0342249 A1   Nov. 24, 2016

(30) Foreign Application Priority Data
Dec. 11, 2014  (CN) .......................... 2014 1 0765460

(51) Int. Cl.
*G09G 5/00* (2006.01)
*G06F 3/041* (2006.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
CPC ......... G02F 1/133512; G02F 1/133308; G02F 1/136227; G02F 2001/13629;
(Continued)

(56) References Cited

U.S. PATENT DOCUMENTS 9,507,471 B2 * 11/2016 Liu ........................ G06F 3/044
2011/0057893 A1   3/2011 Kim et al.
(Continued)

FOREIGN PATENT DOCUMENTS

CN   101131492   2/2008
CN   101446877   6/2009
(Continued)

OTHER PUBLICATIONS

International Search and Written Opinion from PCT/CN15/077677 dated Aug. 26, 2015.
(Continued)

*Primary Examiner* — Duc Q Dinh
(74) *Attorney, Agent, or Firm* — Calfee, Halter & Griswold LLP

(57) ABSTRACT

Embodiments of the invention relate to the technical field of displaying technology, and provide a touch display panel and manufacture method thereof, as well as a display device, which may mitigate or avoid the problem of uniformity of displayed image caused by the difference of the transmittances between the region of the touch electrode and the region of the lead. The manufacture method for a touch display panel comprises: forming a touch electrode in an electrode region; forming a lead connected with the touch electrode in a lead region; collecting a first transmittance of
(Continued)

the electrode region and a second transmittance of the lead region respectively; determining difference values between a preset reference value and the first transmittance as well as the preset reference value and the second transmittance respectively; setting a light shading area of the electrode region and/or the lead region based on the difference values to compensate for the first transmittance and/or the second transmittance.

8 Claims, 4 Drawing Sheets

(51) Int. Cl.
    *G06F 3/044*     (2006.01)
    *H01L 27/12*     (2006.01)

(52) U.S. Cl.
    CPC ........ *H01L 27/124* (2013.01); *H01L 27/1259* (2013.01); *G06F 2203/04103* (2013.01)

(58) Field of Classification Search
    CPC .... G09G 2320/0626; G09G 2300/0426; G06F 2203/04112; G06F 3/0412; G06F 2203/04103; G06F 1/16; G06F 3/047; G06F 17/5081; G06F 3/0418; G06F 3/044; G06F 3/0416; G06F 2203/04111; G06F 2203/04107; G06F 1/1684; G06F 2203/04106
    USPC ........................... 345/173–175; 315/173–175
    See application file for complete search history.

(56) References Cited

U.S. PATENT DOCUMENTS

| | | | |
|---|---|---|---|
| 2012/0327569 A1 | 12/2012 | Park et al. | |
| 2015/0212630 A1* | 7/2015 | Naito | G06F 3/0412 |
| | | | 345/174 |

FOREIGN PATENT DOCUMENTS

| | | | | |
|---|---|---|---|---|
| CN | 101488066 | | 7/2009 | |
| CN | 102012761 A | | 4/2011 | |
| CN | 103246422 | | 8/2013 | |
| CN | 203588222 | | 5/2014 | |
| CN | 103970392 | | 8/2014 | |
| CN | 203838681 | | 9/2014 | |
| CN | 104123054 A | * | 10/2014 | ........... G02F 1/1333 |
| CN | 104123054 A | | 10/2014 | |
| CN | 104461146 | | 3/2015 | |
| CN | 204242149 | | 4/2015 | |
| JP | 2010286886 | | 12/2010 | |

OTHER PUBLICATIONS

Second Office action from Chinese Application No. 201410765460.3 dated Jul. 19, 2017.

Office Action from China Application No. 201410765460.3 dated Jan. 5, 2017.

* cited by examiner

TOUCH DISPLAY PANEL AND MANUFACTURE METHOD THEREOF, DISPLAY DEVICE

RELATED APPLICATIONS

The present application is the U.S. national phase entry of PCT/CN2015/077677, filed Apr. 28, 2015, which claims the benefit of Chinese Patent Application No. 201410765460.3, filed Dec. 11, 2014, the entire disclosures of which are incorporated herein by reference.

FIELD OF THE INVENTION

The present invention relates to the technical field of displaying technology, and in particular to a touch display panel and manufacture method thereof, as well as a display device.

BACKGROUND ART

With the rapid development of displaying technology, touch display panels have been popularized in people's life. Currently, the touch display panels can be classified into Add on Mode Touch panel and In Cell Touch Panel in terms of composition structure.

As to the Add on Mode Touch panel, its touch components and liquid crystal display (LCD) screen are produced separately, which then are laminated together to form a LCD panel with touch function.

The In Cell Touch Panel utilizes principles of self-capacitance or mutual capacitance to achieve detection of touch position by fingers. Specifically, there exists mutual capacitance in the mutual capacitance display panel created by a touch driving electrode Tx and a touch sensing electrode Rx. During the time period of touch, due to the influence of human body electric field, capacitance values of the mutual capacitance will change, thereby the touch position can be determined by variance of the capacitance values. The self-capacitance display panel is provided with a plurality of touch electrodes (referred to as self-capacitance electrodes hereinafter) which can generate the self-capacitance with human body. Capacitance values corresponding to respective self-capacitance electrodes are fixed values when human body is not touching the display panel, whereas capacitance values corresponding to respective self-capacitance electrodes will be the combination of the fixed value and human body capacitance when human body is touching the display panel, thus the touch position can be determined by detecting the variances of capacitance values corresponding to respective self-capacitance electrodes.

Furthermore, the touch electrodes in the touch display panel are all connected to a driving IC (integrated circuit) in a non-displaying area by leads, so that a control signal can be transmitted to said electrodes. As shown in FIG. 1, taking the mutual capacitance touch panel of the In Cell touch panel as an example, the touch driving electrode Tx and the touch sensing electrode Rx functioning as the touch electrodes are both connected with leads 10. However, since there are differences between the touch pattern corresponding to the region of the touch driving electrode Tx and the touch sensing electrode Rx and the touch pattern corresponding to the region of the leads 10, light transmittances of the two regions are different. Thus, the touch patterns may be displayed during the process of displaying image, uniformity of displayed image will be affected, lowering displaying effect.

SUMMARY

Embodiments of the invention provide a touch display panel and manufacture method thereof, as well as a display device, which may mitigate or avoid the problem of uniformity of displayed image caused by the difference of the transmittances between the region of the touch electrode and the region of the lead.

Embodiments of the invention employ technical solutions as follows.

In one aspect, an embodiment of the invention provides a manufacture method for a touch display panel, the method comprises: forming a touch electrode in an electrode region; forming a lead connected with the touch electrode in a lead region; collecting a first transmittance of the electrode region and a second transmittance of the lead region respectively; determining difference values between a preset reference value and the first transmittance as well as the preset reference value and the second transmittance respectively; setting a light shading area of the electrode region and/or the lead region based on the difference values to compensate for the first transmittance and/or the second transmittance.

In another aspect, an embodiment of the invention provides a touch display panel, the display panel comprising an electrode region and a lead region, wherein a touch electrode is arranged in the electrode region, a lead connected with the touch electrode is arranged in the lead region, and a first transmittance of the electrode region is equal to a second transmittance of the lead region.

In yet another aspect, an embodiment of the invention provides a display device, which may comprise anyone of the touch display panels provided by the various embodiments of the invention.

Embodiments of the invention provide a touch display panel and manufacture method thereof, as well as a display device. The manufacture method for the touch display panel comprises: forming a touch electrode in an electrode region; forming a lead connected with the touch electrode in a lead region, so that a driving voltage can be transmitted to the touch electrode by the lead; collecting a first transmittance corresponding to the region of the touch electrode (i.e. the electrode region) and a second transmittance corresponding to the region of the lead connected with the touch electrode (i.e. the lead region) respectively; comparing the first transmittance and the second transmittance with the preset reference value respectively to determine corresponding difference values between the preset reference value and them; setting light shading areas of the electrode region and/or the lead region based on the obtained difference values to compensate for the first transmittance or the second transmittance, so that the first transmittance is equal to the second transmittance. Therefore, the non-uniformity of the displayed image caused by different light transmittance between the electrode region and the lead region can be avoided, improving the displaying effect.

BRIEF DESCRIPTION OF DRAWINGS

In order to explain the technical solutions of embodiments of the invention or the prior art more clearly, next, a brief introduction will be made for drawings used in the description of the embodiments of the invention or the prior art. Apparently, the drawings described below are just some embodiments of the present invention, other drawings can be obtained from these figures for the skilled person in the art without creative efforts.

REFERENCE NUMBERS IN THE DRAWINGS

01 - a driving IC;   10 - a lead;   20 - a touch electrode
100 - a lead region;   200 - an electrode region;
300 - a black matrix in the electrode region;
300' - a black matrix in the lead region;
301 - a region of TFT in the electrode region;
301' - a region of TFT in the lead region;
Tx - a touch driving electrode;   Rx - a touch sensing electrode

DETAILED DESCRIPTION OF EMBODIMENTS

In the following, technical solutions of embodiments of the invention will be described clearly and entirely in connection with figures for embodiments of the invention. Apparently, the embodiments described are just a part of embodiments of the invention, rather not the whole embodiments. All other embodiments obtained on the basis of these described embodiments by the skilled person in the art without creative effort belong to the protection scope of the invention.

Figure 1:
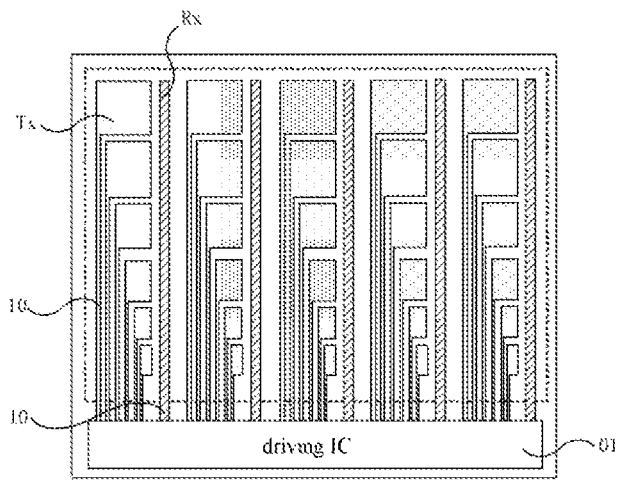
FIG. 1 is a structural schematic diagram of a touch display panel provide by the prior art.
Figure 2:
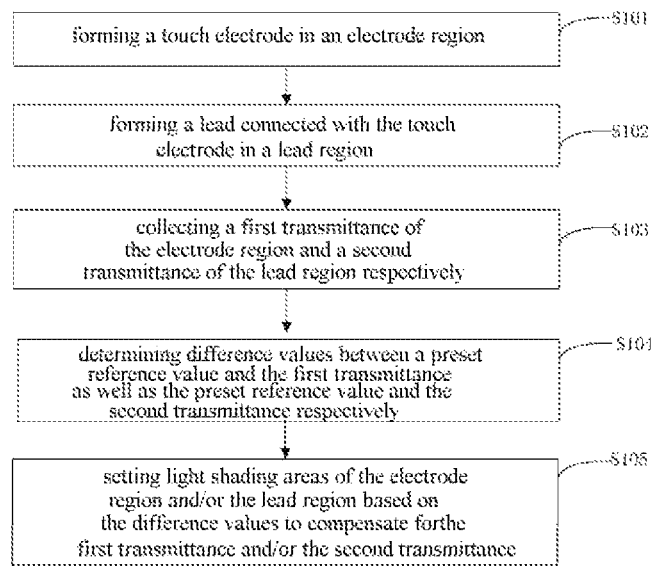
FIG. 2 is a flow chart of a manufacture method for a touch display panel provided by an embodiment of the invention.
Figure 3:
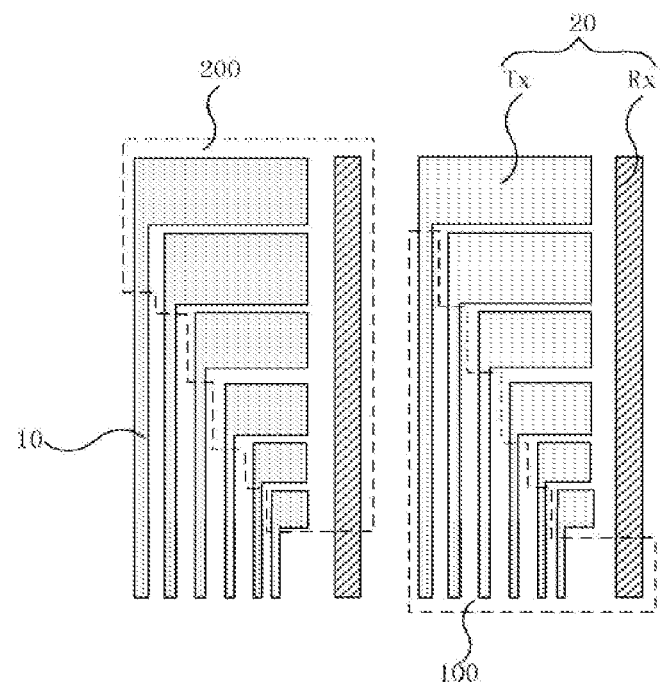
FIG. 3 is a schematic diagram showing the region division for the touch display panel provided by an embodiment of the invention.

An embodiment of the invention provides a manufacture method for a touch display panel, as shown in FIG. 2, the method can comprise:

S101. forming a touch electrode 20 in an electrode region 200, as shown in FIG. 3;

S102. forming a lead 10 connected with the touch electrode 20 in a lead region 100;

S103. collecting a first transmittance of the electrode region 200 and a second transmittance of the lead region 100 respectively.

Wherein said transmittance refers to the transmittance of light rays. The transmittance of light rays can be collected by a photosensitive element. Alternatively, covering area of the touch electrode 20 in the electrode region 200 and covering area of the lead 10 in the lead region 100 can be calculated, then the transmittance of light rays can be obtained on the basis of the covering areas of the thin film layers for the touch electrode 20 or the lead 10, as well as the material constituting these thin film layers, and so on.

S104. determining difference values Δt between a preset reference value T and the first transmittance T1 as well as the preset reference value T and the second transmittance T2 respectively.

S105. setting light shading areas of the electrode region 200 and/or the lead region 100 based on the difference values Δt to compensate for the first transmittance T1 and/or the second transmittance T2.

It is noted that, the touch display panel can be of Add on Mode, and also can be an In Cell touch panel, which is not limited by the present invention. However, the following embodiments are all illustrated by example of the In Cell touch panel. Moreover, the In Cell touch panel may comprise the mutual capacitance touch display panel and the self-capacitance touch display panel. For the mutual capacitance touch display panel, the touch electrode 20 can be the touch driving electrode Tx and the touch sensing electrode Rx, which can constitute a mutual capacitance. For the self-capacitance touch display panel, the touch electrode 20 can be the self-capacitance electrode that can constitute a self-capacitance with human body or ground.

The touch electrode 20 in embodiments of the invention are illustrated by example of the touch driving electrode Tx and the touch sensing electrode Rx that can constitute a mutual capacitance.

Therefore, in embodiments of the invention, the electrode region 200 refers to the region of the touch driving electrode Tx and the touch sensing electrode Rx in the touch display panel, the lead region 100 refers to the region of the leads 10 in the touch display panel connected with the touch driving electrode Tx and the touch sensing electrode Rx.

Said preset reference value T may be the first transmittance T1, the second transmittance T2 of the lead region 100 can be equal to the first transmittance T1 by adjusting the light shading area of the lead region 100. Alternatively, said preset reference value T can be the second transmittance T2, the first transmittance of the electrode region 200 can be equal to the second transmittance T2 by adjusting the light shading area of the electrode region 200. Or, the preset reference value T may be a third value set by the skilled person in the art in light of actual requirement, the first transmittance T1 and the second transmittance T2 both can be equal to the third value by adjusting the light shading areas of the lead region 100 and electrode region 200 respectively. Embodiments of the invention will be explained by way of example in which the preset reference value T is the first transmittance T1 or the second transmittance T2.

The embodiment of the invention has provided a manufacture method for a touch display panel, the method comprising: forming a touch electrode in an electrode region; then, forming a lead connected with the touch electrode in a lead region to transmit a driving voltage to the touch electrode by the lead; next, collecting a first transmittance corresponding to the region of the touch electrode (i.e. the electrode region) and a second transmittance corresponding to the region of the lead connected with the touch electrode (i.e. the lead region) respectively; and comparing the first transmittance and the second transmittance with the preset reference value respectively to determine difference values between the preset reference value and them; finally, setting light shading areas of the electrode region and/or the lead region based on the obtained difference values to compensate for the first transmittance or the second transmittance, so that the first transmittance is equal to the second transmittance. Therefore, the non-uniformity of the displayed image caused by different transmittance of light rays between the electrode region and the lead region can be avoided, improving the displaying effect.

Transmittances of the electrode region 200 or lead region 100 are related to the light shading areas of the electrode region 200 or lead region 100 respectively. The larger the light shading area is, the lower the transmittance is; the smaller the light shading area is, the higher the transmittance is. The transmittance is also related to the material constituting the thin film layer of the touch electrode or lead. The touch electrode 20 and the lead 10 can be arranged in the same layer with the same material in order to simplify the manufacture process. Transparent conductive material such as Indium Tin Oxide (ITO) can be used. Thus, since both the touch electrode 20 and the lead 10 are made from ITO, materials of the thin film layers for the touch electrode or lead may have the same affect on the transmittance for the two regions.

As shown in FIG. 3, the coverage rate of the ITO thin film for the touch electrode 20 in the electrode region 200 is higher than that of the ITO thin film for the lead 10 in the lead region 100. As a result, the first transmittance T1 of the electrode region 200 is less than the second transmittance T2 of the lead region 100 currently. Consequently, the light shading area of the electrode region 200 can be reduced or the light shading area of the lead region 100 can be increased such that the first transmittance T1 is equal to the second transmittance T2.

In the following, the method for setting the light shading areas of the electrode region 200 and/or the lead region 100 based on the difference values Δt between the first transmittance T1 and the preset reference value T as well as the second transmittance T2 and the preset reference value T will be illustrated in detail by way of specific examples.

In one embodiment, the smallest displaying unit of the display panel is a pixel unit that may comprise a display region and non-display region. Pixel electrodes are arranged within the display region, and switching element controlling the pixel electrode by charging is arranged within the non-display region, for example, a TFT (Thin Film Transistor). Black matrixes can be arranged at positions corresponding to the TFT on the light emitting side of the display panel, so as not to affect the electrical performance of the TFT. Because of the light shading effect of the black matrix, the larger the area of the black matrix is, the larger the light shading area of the pixel unit is, and the lower the transmittance of light rays is.

Consequently, in the case where the touch display panel comprises the black matrix, the step S105 may comprise: setting the areas of the black matrixes in the electrode region 200 and/or the lead region 100 based on the difference values Δt between the first transmittance T1 and the preset reference value T as well as the second transmittance T2 and the preset reference value T.

Specifically, when the second transmittance T2 is used as the preset reference value T, since the first transmittance T1 is less than the second transmittance T2 at present, the first transmittance T1 needs to be increased, thus it is required to reduce the area of the black matrix 300 in the electrode region 200, so as to compensate for the first transmittance T1.

Alternatively, when the first transmittance T1 is used as the preset reference value T, since the first transmittance T1 is less than the second transmittance T2 at present, the second transmittance T2 needs to be decreased, thus it is required to increase the area of the black matrix 300' in the lead region 100, so as to compensate for the second transmittance T2 negatively.

As a result, the area of the black matrix 300 in the electrode region 200 is smaller than that of the black matrix 300' in the lead region 100.

In another embodiment, it is considered that the TFT has light shading characteristic, therefore, the larger the area of TFT region is, the larger the light shading area of the pixel unit is, and the lower the transmittance of light rays is.

As a result, in the case where the touch display panel comprises TFT, the step S105 may comprise: setting the areas of the TFT in the electrode region 200 and/or the lead region 100 based on the difference values Δt between the first transmittance T1 and the preset reference value T as well as the second transmittance T2 and the preset reference value T.

Specifically, when the second transmittance T2 is used as the preset reference value T, since the first transmittance T1 is less than the second transmittance T2 at present, the first transmittance T1 needs to be increased, thus it is required to reduce the area of the region 301 of TFT in the electrode region 200, so as to compensate for the first transmittance T1.

Alternatively, when the first transmittance T1 is used as the preset reference value T, since the first transmittance T1 is less than the second transmittance T2 at present, the second transmittance T2 needs to be decreased, thus it is required to increase the area of region 301' of TFT in the lead region 100, so as to compensate for the second transmittance T2 negatively.

Figure 5:
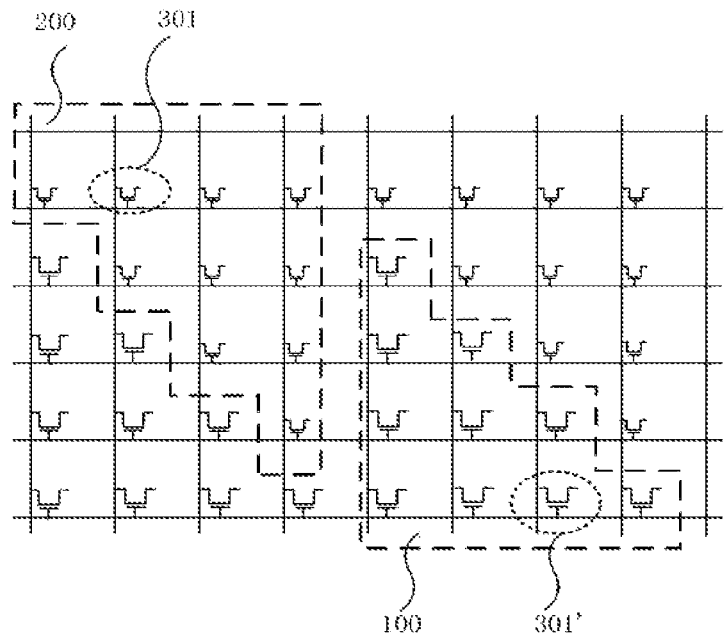
FIG. 5 is a structural schematic diagram illustrating the non-uniform sizes of the regions of TFT provided by an embodiment of the invention.

As a result, as shown in FIG. 5, the area of region 301 of TFT in the electrode region 200 is smaller than that of region 301' of TFT in the lead region 100.

The TFT is typically composed of a gate, a source and a drain, which may be formed with metal material so as to ensure a higher conductivity of the TFT. The metal material may comprise single metal or metal alloy, which are opaque materials. Therefore, setting the area of the region of TFT may comprise setting the areas of the gate, the source or the drain of TFT.

Furthermore, common electrode lines of the display panel are usually made from gate metal, hence the common electrode lines may have light shading characteristic. The larger the area of the common electrode lines is, the light shading area of the pixel unit is, and the lower the transmittance of light rays is.

As a result, in the case where the touch display panel comprises the common electrode lines, the step S105 may comprises: setting the areas of the common electrode lines in the electrode region 200 and/or the lead region 100 based on the difference values Δ t between the first transmittance T1 and the preset reference value T as well as the second transmittance T2 and the preset reference value T. Specific details for the setting may be similar to the above, and will not be described in detail herein.

In a further embodiment, the second transmittance T2 may be used as the preset reference value T, since the first transmittance T1 is less than the second transmittance T2 at present, the first transmittance T1 needs to be increased.

Specifically, a pierced pattern can be formed on the surface of the touch electrode 20 by patterning process, wherein the positions corresponding to the pierced pattern are not covered by the touch electrode 20. Thus, the light shading area of the touch electrode 20 can be reduced, thereby the first transmittance T1 of the electrode region 200 can be enhanced, and the first transmittance T1 can be equal to the second transmittance T2 of the lead region 100 by compensating for the first transmittance T1.

Figure 6A:
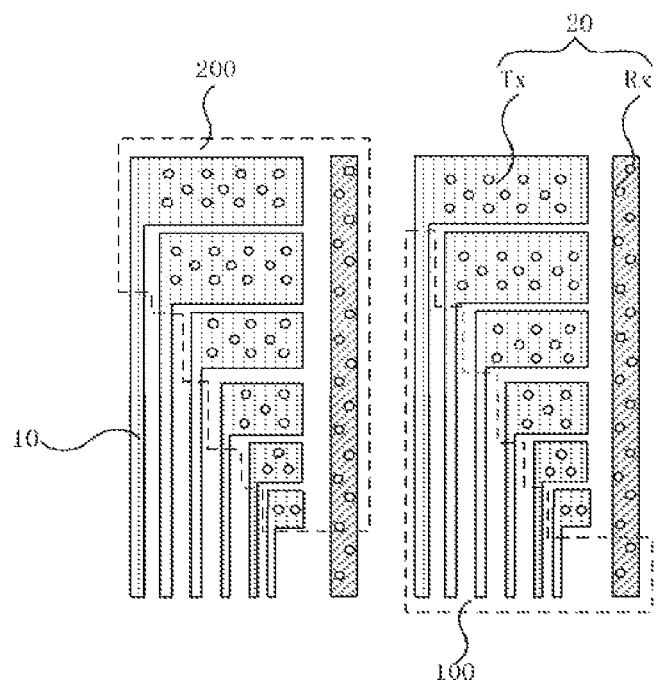
FIG. 6a is a partial structural schematic diagram of a touch display panel provided by an embodiment of the invention.
Figure 6B:
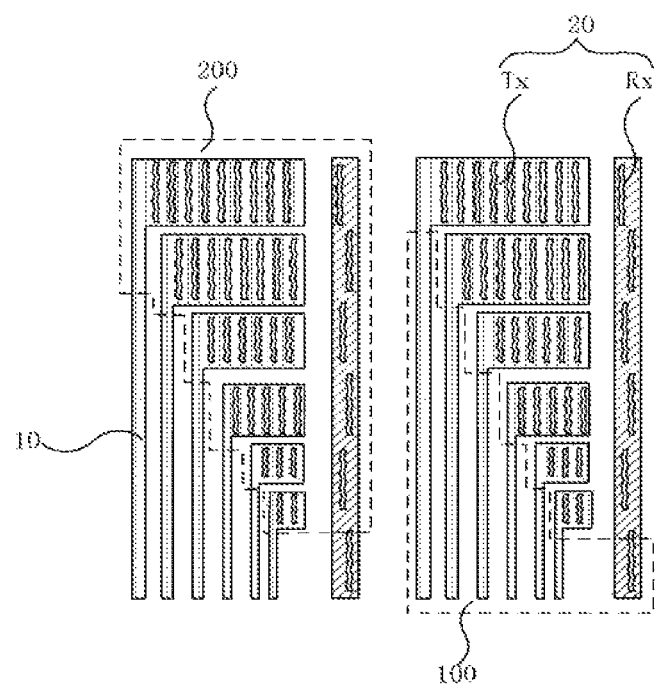
FIG. 6b is a partial structural schematic diagram of a touch display panel provided by another embodiment of the invention.

Furthermore, for convenience of manufacture, the pierced pattern may be a round dot shape pattern as shown in FIG. 6a or a stripe pattern as shown in FIG. 6b. The pattern direction for the stripe pattern is not limited by the invention, which may be a longitudinal stripe pattern as shown in FIG. 6b, and may also be a lateral stripe pattern perpendicular to the longitudinal stripe pattern shown in FIG. 6b, and further can be a slanting stripe pattern having a angel relative to the longitudinal stripe pattern shown in FIG. 6b. The stripe pattern may have the shape of a square or a rectangle, and so on. In addition, the pierced pattern may be a stripe combination pattern, for example, the pierced pattern may be a pattern combined by two strips, such as a T-shaped or V-shaped pattern, or a pattern combined by multiple stripes, such as patterns having the shape of Chinese characters "工" or "米", and so on.

Of course, the above mentioned is just example illustration for the pierced pattern, pierced patterns of other shapes should belong to the protection scope of the invention, which are not discussed in detail herein.

A touch display panel is also provided by an embodiment of the invention, as shown in FIG. 3, the touch display panel may comprise: an electrode region 200 and a lead region 100, wherein a touch electrode 20 is arranged in the electrode region 200, and a lead 10 connected with the touch electrode 20 is arranged in the lead region 100. A first transmittance T1 of the electrode region 200 is equal to the second transmittance T2 of the lead region 100.

The embodiment of the invention provides a touch display panel comprising the electrode region and the lead region, wherein the touch electrode is arranged in the electrode region, and a lead connected with the touch electrode is arranged in the lead region. The first transmittance of the electrode region is equal to the second transmittance of the lead region. Therefore, the non-uniformity of the displayed image caused by different transmittance of light rays between the electrode region and the lead region can be avoided, improving the displaying effect.

Transmittances of the electrode region 200 or lead region 100 are related to the light shading areas of the electrode region 200 or lead region 100 respectively. The larger the light shading area is, the lower the transmittance is; the smaller the light shading area is, the higher the transmittance is. The transmittance is also related to the material constituting the thin film layer of the touch electrode or the lead. The touch electrode 20 and the lead 10 can be arranged in the same layer with the same material in order to simplify the manufacture process. Transparent conductive material such as Indium Tin Oxide (ITO) can be used. Thus, since both the touch electrode 20 and the lead 10 are made from ITO, materials of the thin film layers for the touch electrode or lead may have the same affect on the transmittance of the two regions.

As shown in FIG. 3, the coverage rate of the ITO thin film for the touch electrode 20 in the electrode region 200 is higher than that of the ITO thin film for the lead 10 in the lead region 100 currently. As a result, the first transmittance T1 of the electrode region 200 is less than the second transmittance T2 of the lead region 100 currently. Consequently, the light shading area of the electrode region 200 can be reduced or the light shading area of the lead region 100 can be increased such that the first transmittance T1 is equal to the second transmittance T2.

In the following, specific structure of the touch display panel for which the first transmittance T1 of the electrode region 200 is equal to the second transmittance T2 of the lead region 100 will be discussed in detail by way of specific examples.

In one embodiment, the smallest displaying unit of the display panel is a pixel unit that may comprise a display region and a non-display region. A pixel electrode is arranged within the display region, and switching element controlling the pixel electrode by charging is arranged within the non-display region, such as a TFT (Thin Film Transistor). A black matrix can be arranged at positions corresponding to the TFT on the light emitting side of the display panel, so as not to affect the electrical performance of the TFT. Because of the light shading effect of the black matrix, the larger the area of the black matrix is, the larger the light shading area of the pixel unit is, and the lower the transmittance of light rays is.

Consequently, in the case where the touch display panel comprises the black matrix, the area of the black matrix in the electrode region 200 can be different from that of the black matrix in the lead region 100.

Specifically, since first transmittance T1 is less than the second transmittance T2 at present, the area of the black matrix 300 in the electrode region 200 may be reduced to increase the first transmittance T1, so that the first transmittance T1 is equal to the second transmittance T2.

Alternatively, the area of the black matrix 300' in the lead region 100 can be increased to lower the second transmittance T2, so that the first transmittance T1 is equal to the second transmittance T2.

Figure 4:
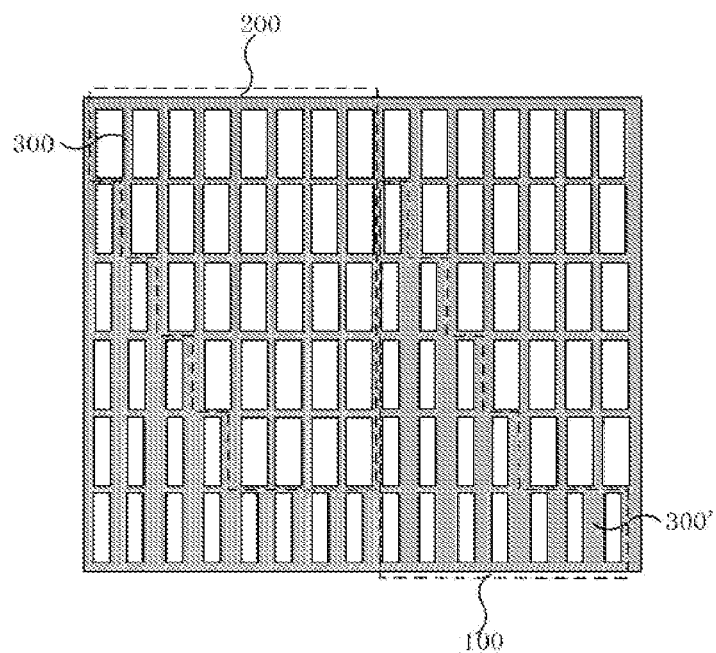
FIG. 4 is a structural schematic diagram illustrating the non-uniform sizes of the black matrixes provided by an embodiment of the invention.

As a result, the area of the black matrix 300 in the electrode region 200 is smaller than that of the black matrix 300' in the lead region 100, as shown in FIG. 4.

In another embodiment, it is considered that the TFT has light shading characteristic, therefore, the larger the area of TFT region is, the larger the light shading area of the pixel unit is, and the lower the transmittance of light rays is.

As a result, in the case where the touch display panel comprises the TFT, the area of the region of TFT in the electrode region 200 is different from that of the region of TFT in the lead region 100.

Specifically, since first transmittance T1 is less than the second transmittance T2 at present, the area of the region 301 of TFT in the electrode region 200 can be reduced to increase the first transmittance T1, so that the first transmittance T1 is equal to the second transmittance T2.

Alternatively, the area of the region 301' in the lead region 100 can be increased to lower the second transmittance T2, so that the first transmittance T1 is equal to the second transmittance T2.

As a result, the area of region 301 of TFT in the electrode region 200 is smaller than that of region 301' of TFT in the lead region 100, as shown in FIG. 5.

The TFT is typically composed of a gate, a source and a drain, the gate of TFT may be formed with gate metal, and the source and the drain of TFT may be formed with data metal, so as to ensure a higher conductivity of the TFT. The metal material may comprise single metal or metal alloy, which are opaque materials. Therefore, setting the area of the region of TFT may comprise setting the areas of the gate, the source or the drain of the TFT, such that the area of the region of TFT in the electrode region is different from that of the region of TFT in the lead region.

Furthermore, common electrode lines of the display panel are usually formed with the gate metal, hence the common electrode lines may have light shading characteristic. The larger the area of the common electrode lines is, the larger the light shading area of the pixel unit is, and the lower the transmittance of light rays is.

As a result, in the case where the touch display panel comprises the common electrode lines, the area of the common electrode lines in the electrode region 200 is different from that of the common electrode lines in the lead region 100, specific details may be similar to the above, and will not be described in detail herein.

In a further embodiment, since the first transmittance T1 is less than the second transmittance T2 at present, a pierced pattern can be formed on the surface of the touch electrode 20 to increase the first transmittance T1, wherein the positions corresponding to the pierced pattern are not covered by the touch electrode 20. Thus, the light shading area of the touch electrode 20 can be reduced, thereby the first transmittance T1 of the electrode region 200 can be enhanced, and the first transmittance T1 can be equal to the second transmittance T2 of the lead region 100.

Furthermore, the pierced pattern may be a round dot shape pattern as shown in FIG. 6a or a stripe pattern as shown in FIG. 6b. The pattern direction for the stripe pattern is not limited by the invention, which may be a longitudinal stripe pattern shown in FIG. 6b, and may also be a lateral stripe pattern perpendicular to the longitudinal stripe pattern shown in FIG. 6b, and further can be a slanting stripe pattern having a angel relative to the longitudinal stripe pattern shown in FIG. 6b.

Of course, the above mentioned is just illustration for the pierced pattern, pierced patterns of other shapes should belong to the protection scope of the invention, which is not discussed in detail herein.

A display device is provided by an embodiment of the invention, which may comprise any one of the touch display panels discussed above. The display device may have the same structure and beneficial effect as the touch display panel provided by embodiments mentioned above. And they are not discussed in detail, since the beneficial effect for the touch display panel has been illustrated in forgoing embodiments.

It is noted that in the embodiments of the invention, the display device may comprise a LCD device, for example, the display device may be any product or component having displaying function, such as a LCD display, a LCD television, a digital photo frame, a mobile phone or tablet computer etc.

It can be understood that by the skilled person in the art that, implementation of the entire or part steps of the above method embodiments may be achieved by a program instructing related hardware, the program may be stored on a medium accessible by a computer and perform the steps of the various method embodiments when running. The medium may comprise various media that can store program code, such as ROM, RAM, diskette and optical disc etc.

The above stated is only specific embodiments of the present invention, but the protection scope of the present invention shall not be limited to these. Any variations or alternatives that are easily conceivable within the technical scope disclosed in the present invention for a skilled person in the art shall fall within the protection scope of the present invention. Therefore, the protection scope of the present invention shall be subject to the protection scope of the claims.

The invention claimed is:

1. A touch display panel comprising an image display area for displaying an image, the image display area comprising an electrode region and a lead region;
    wherein the electrode region is provided with a touch electrode, the lead region is provided with a lead connected to the touch electrode;
    wherein each of the electrode region and the lead region comprises at least one pixel unit, each pixel unit comprising a sub-display region and a non-display region, the sub-display region is provided with a pixel electrode, the non-display region is provided with a thin film transistor electrically connected with the pixel electrode,
    wherein a first transmittance of the electrode region is equal to a second transmittance of the lead region, wherein an area of the thin film transistor in the electrode region is smaller than an area of the thin film transistor in the lead region.

2. A touch display panel according to claim 1, wherein an area of a black matrix in the electrode region is different from that of an area of a black matrix in the lead region.

3. A touch display panel according to claim 1, wherein an area of a common electrode line in the electrode region is different from an area of a common electrode line in the lead region.

4. A touch display panel according to claim 1, wherein a pierced pattern is formed on a surface of the touch electrode, wherein positions corresponding to the pierced pattern are not covered by the touch electrode.

5. A touch display panel according to claim 4, wherein the pierced pattern is selected from a group consisting of a round dot pattern and a strip pattern.

6. A display device comprising a touch display panel, the touch display panel comprising an image display area for displaying an image, the image display area comprising an electrode region and a lead region,
    wherein the electrode region is provided with a touch electrode, the lead region is provided with a lead connected to the touch electrode;
    wherein each of the electrode region and the lead region comprises at least one pixel unit, each pixel unit comprising a sub-display region and a non-display region, the sub-display region is provided with a pixel electrode, the non-display region is provided with a thin film transistor electrically connected with the pixel electrode,
    wherein a first transmittance of the electrode region is equal to a second transmittance of the lead region, wherein an area of the thin film transistor in the electrode region is smaller than an area of the thin film transistor in the lead region.

7. The display device according to claim 6, wherein an area of a black matrix in the electrode region is different from an area of a black matrix in the lead region.

8. The display device according to claim 6, wherein an area of a common electrode line in the electrode region is different from an area of a common electrode line in the lead region.

* * * * *